US005096788A

United States Patent [19]

Bresin et al.

[11] Patent Number: 5,096,788

[45] Date of Patent: Mar. 17, 1992

[54] WELDLESS BATTERY PACK

[75] Inventors: Mark S. Bresin, Coral Springs; Stephen D. Hunt, Davie; Mac W. Branan, Jr., Fort Lauderdale; Paul A. Magnifico, Sunrise; Christian Schneider, Plantation, all of Fla.

[73] Assignee: Motorola, Inc., Schaumburg, Ill.

[21] Appl. No.: 592,089

[22] Filed: Oct. 5, 1990

[51] Int. Cl.[5] .............................................. H01M 2/20

[52] U.S. Cl. ....................................... 429/99; 429/159

[58] Field of Search ................................. 429/99, 100

[56] References Cited

U.S. PATENT DOCUMENTS 3,110,634 11/1963 Bradshaw ............................ 429/99
4,205,121 5/1980 Naitoh .................................. 429/99
4,443,523 4/1984 Hasenauer ............................ 429/99
4,593,461 6/1986 Thiele et al. ...................... 429/99 X
4,604,799 8/1986 Gurol .................................. 29/897
4,912,288 3/1990 Atkinson et al. .................. 174/251

*Primary Examiner*—Stephen Kalafut
*Attorney, Agent, or Firm*—Pablo Meles

[57] ABSTRACT

The present invention provides for a battery pack (30) comprising a housing (31) and a plurality of cells (46) within the housing (41), each cell having a positive and negative terminal. A flex circuit (48) is provided for interconnecting between the plurality of cells (46). The battery pack (30) additionally comprises biasing means (38) for providing sufficient contact pressure between the flex circuit (48) and the cell terminals.

16 Claims, 2 Drawing Sheets

44
39
38
41
40
46
40
41
48
42
39
38
36
34
32
31
30

WELDLESS BATTERY PACK

TECHNICAL FIELD

This invention relates generally to battery cell packs, and more specifically to weldless battery packs.

BACKGROUND

Battery packs for portable devices such as two-way radios typically comprise a number of cells having contacts welded together all within a housing. The individual cells are interconnected using sheet metal tabs which are spot welded to the cell terminals. Usually, the interconnected cells are then spot welded to a flex circuit and subsequently inserted into a battery housing. This method of manufacture is wrought with inefficient assembly procedures and unnecessary parts and labor resulting in excessive manufacturing expense and compromised reliability.

Consumer loaded batteries for consumer electronics such as cameras, radios, CD players, etc., typically have spring loaded contacts on one end and metal contacts coupled to the opposite end of the primary cells. Consumer loaded battery packs do not require the extra circuit typically found in battery packs. Battery packs for portable radios will usually include resistors, thermistors, diodes and other components that enable the battery packs to be rechargeable and/or instrinsically safe. Thus, consumer loaded battery compartments may only have stamped metal on the housing and electrical loss between battery cells and circuitry is of little concern in these applications. Therefore, a need exits for a battery pack that provides the convenience of consumer loaded battery packs, and allows for greater efficiency and reduced cost in assembly and manufacture.

SUMMARY OF THE INVENTION

Accordingly, a battery pack comprises a battery pack having a housing and a plurality of cells within the housing, each cell having a positive and negative terminal. A flex circuit is provided for interconnecting between the plurality of cells. The battery pack additionally comprises biasing means for providing sufficient contact pressure between the flex circuit and the cell terminals.

DETAILED DESCRIPTION OF THE PREFERRED EMBODIMENT

Figure 1:
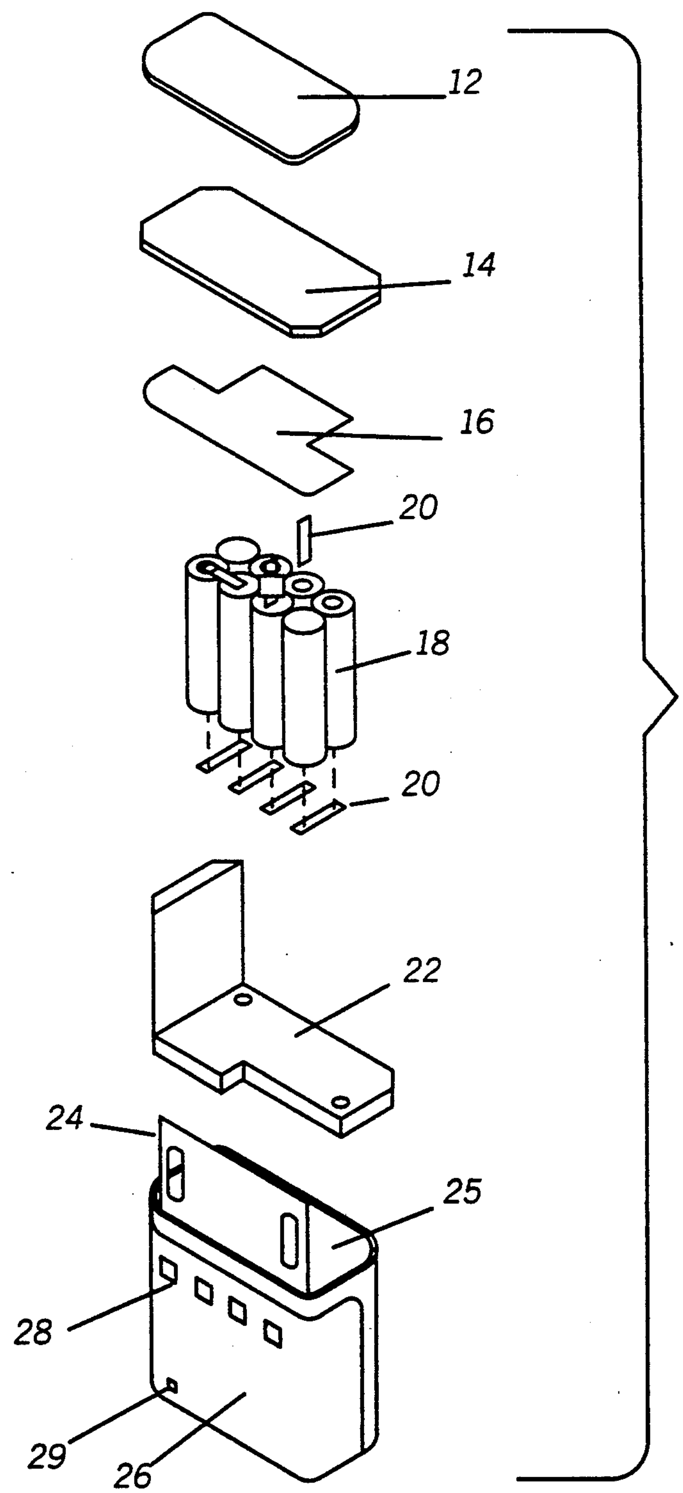
FIG. 1 is a perspective view of a battery pack as is known in the art.

Referring to FIG. 1, there is shown a typical battery pack 10 as is known in the art. The battery pack 10 preferably comprises a battery housing 26 having an aperture 25. Within the aperture 25, a flex circuit 24 is inserted having charger contacts for inserting into apertures 28. The battery housing 26 may optionally have a ventilation hole 29 for release of gases generated from the battery chemistry. The shock pads 14 and 22 are used to dampen the movement of the cells 18 when the battery pack 10 is dropped or receives a sudden impact. The cells 18 have their respective adjacent positive and negative terminals connected together via steel tabs 20. The steel tabs are typically spot welded to the terminals and then welded or soldered to the contacts on the flex circuit 24. Since the steel tabs are welded to the flex circuit, there is little concern whether enough force exists between cell terminals and the contacts. An insulator 16 is placed between the cells and the shock pad 14 to assist in preventing shorts between the cells. Finally, a housing cover 12 is placed on top of the shock pad 14 to seal the assembly 10.

Figure 2:
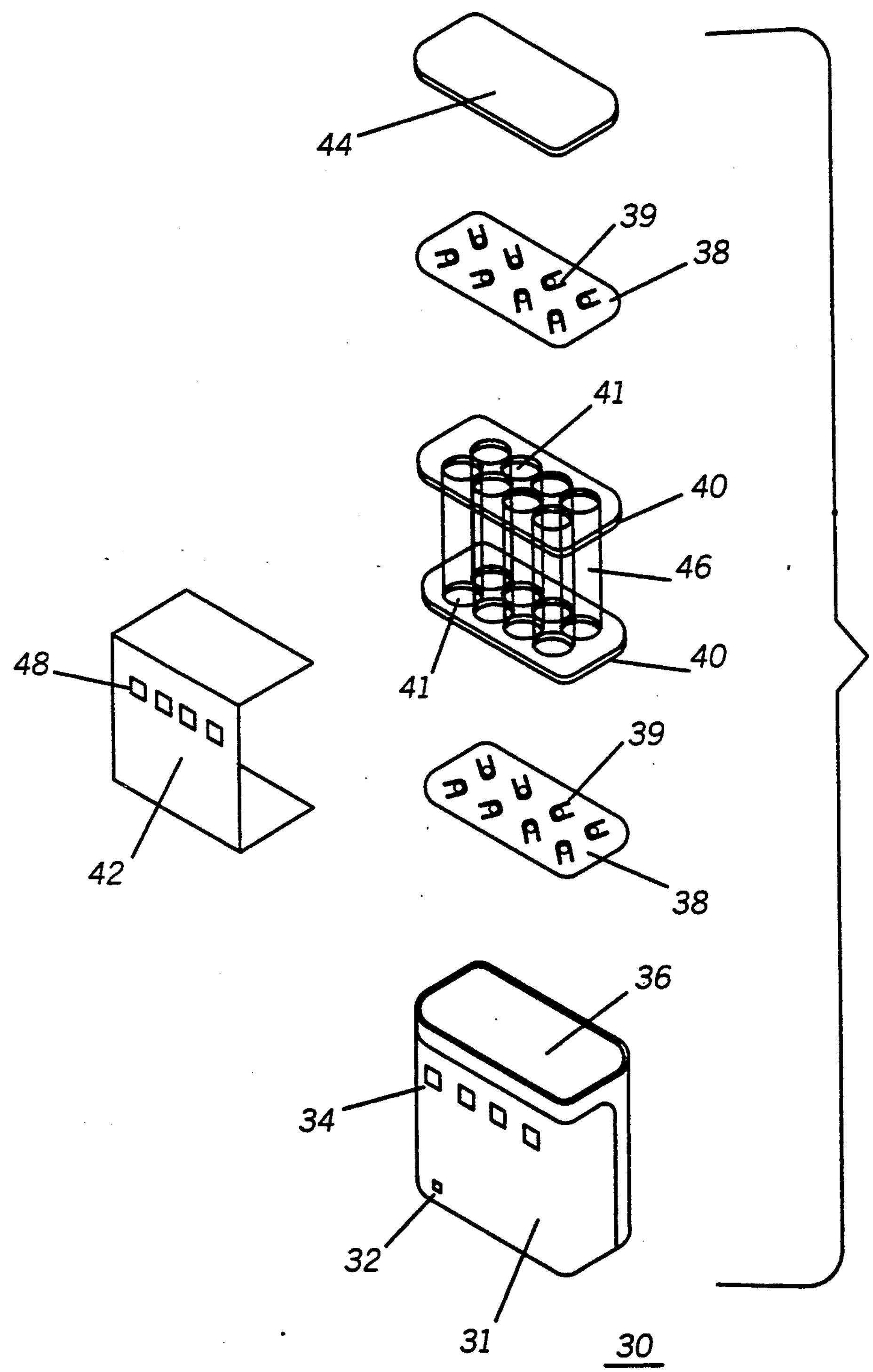
FIG. 2 is a perspective view of a battery pack in accordance with the present invention.

Referring to FIG. 2, there is shown a battery pack 30 arranged and constructed in accordance with the present invention. The battery pack 30 preferably comprises a housing 31 having an aperture 36 for receiving cells 46 and having apertures 34 serving as receptacles for charger contacts 48. The battery housing 31 may optionally have another aperture 32 for use as a ventilation hole to release any gases created by the battery cell chemistry.

The cells are preferably aligned using a pair of locating headers 40. The locating headers 40 have apertures 41 at opposing ends to allow the positive and negative terminals of the cells 46 to preferably protrude slightly from the headers 40. A flex circuit 42 is oriented to cover the pair of locating headers 40 and to couple the appropriate cell terminals. Sufficient contact pressure is applied to the cell terminal surfaces by the flex circuit 42 by using a pair of contact headers 38 preferably having a plurality of spring fingers 39. One contact header is placed between the flex circuit and the inside bottom portion of the housing 31, while the second header is placed between the flex circuit and a lid 44 which seals the battery pack 30. Each contact header 38 includes integral spring fingers which are biased to provide sufficient contact pressure between the flex circuit 42 and the cell terminals. The contact header is preferably made of metal, but any material such as plastic providing sufficient contact pressure between the flex circuit and the cell terminals can be used.

In assembling the battery pack 30, the bottom contact header 38 is placed on the bottom of the housing 31. Then, the plurality of cells 46, being aligned by the locating headers 40, is "wrapped" by the flex circuit 42 and inserted through the aperture 36 into the housing 31. The contacts 48 on the flex circuit 42 can be snapped into the apertures 34 in the housing 31. Once the flex circuit is oriented, the top contact header (38) in place above the flex circuit. Finally, the lid 44 seals the battery pack 30.

What is claimed is:

1. A battery pack, comprising:
   - a housing having a lid;
   - a plurality of cells within said housing, each cell having a positive and negative terminal; and
   - a flex circuit for providing interconnection between said plurality of cells;
   - a first member placed between the inside bottom surface of the housing and the flex circuit; and
   - a second member placed between the lid and the flex circuit, each of said first and said second members include spring fingers, said spring fingers being biased toward said positive and negative terminals and providing the interconnection for said plurality of cells.

2. The battery pack of claim 1, wherein the flex circuit further comprises battery contacts for providing power to a detachable electric device.

3. The battery pack of claim 1, wherein the flex circuit further comprises charger contacts for recharging said plurality of cells.

4. The battery pack of claim 1, wherein the flex circuit further comprises battery contacts for providing power to a portable electronic device and charger contacts for recharging said plurality of cells.

5. The battery pack of claim 1, wherein said battery pack couples to a radio.

6. A battery pack, comprising:

a plurality of cells, each cell having a positive and negative terminal and being interconnected by a flex circuit within a housing having a lid;

spring finger means for retaining said interconnected cells in said housing, said means having a first member placed between the inside bottom surface of the housing and the flex circuit and a second member placed between the lid and the flex circuit, each of said first and second members having spring fingers being biased towards said positive and negative terminals and providing the interconnection for said plurality of cells.

7. The battery pack of claim 6, wherein the plurality of cells are arranged and constructed to have alternating positive and negative terminals adjacent to one another.

8. The battery pack of claim 6, wherein the spring finger means further comprises a pair of locating headers.

9. The battery pack of claim 6, wherein the flex circuit further comprises metallized protrusions coupled to the flex circuit for providing battery contacts.

10. The battery pack of claim 6, wherein the flex circuit further comprises metallized protrusions coupled to the flex circuit for providing charger contacts.

11. The battery pack of claim 6, wherein the flex circuit further comprises metallized protrusions coupled to the flex circuit for providing battery contacts and charger contacts.

12. The battery pack of claim 9, wherein the battery couples to a radio.

13. A battery pack, comprising:

a plurality of cells within said housing, each cell having a positive and negative terminal; and locater means for aligning said plurality of cells and exposing said terminals;

a flex circuit disposed on the surface of said terminals for providing at least some interconnection for said plurality of cells;

biasing means for providing sufficient contact pressure between the terminals of said plurality of cells and said flex circuit, said biasing means comprising spring fingers being biased toward said positive and negative terminals and being located between said housing and said flex circuit.

14. The battery pack of claim 13, wherein the circuit disposed on said housing further comprises charger contacts for recharging said plurality of cells.

15. The battery pack of claim 13, wherein said flex circuit further comprises battery contacts for providing power to a portable electronic device and charger contacts for recharging said plurality of cells.

16. The battery pack of claim 13, wherein said battery pack couples to a radio.

* * * * *